(12) United States Patent
Kim

(10) Patent No.: US 11,469,263 B2
(45) Date of Patent: Oct. 11, 2022

(54) IMAGE SENSOR

(71) Applicant: SK hynix Inc., Icheon-si (KR)

(72) Inventor: Dong Ha Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 179 days.

(21) Appl. No.: 16/839,279

(22) Filed: Apr. 3, 2020

(65) Prior Publication Data

US 2021/0057471 A1 Feb. 25, 2021

(30) Foreign Application Priority Data

Aug. 20, 2019 (KR) .................. 10-2019-0101801

(51) Int. Cl.
*H01L 27/146* (2006.01)

(52) U.S. Cl.
CPC .... *H01L 27/14621* (2013.01); *H01L 27/1463* (2013.01); *H01L 27/14605* (2013.01); *H01L 27/14627* (2013.01); *H01L 27/14685* (2013.01)

(58) Field of Classification Search
CPC ......... H01L 27/14621; H01L 27/14605; H01L 27/1463; H01L 27/14685; H01L 27/14629; H01L 27/14623; H01L 27/14625; H01L 27/14643
See application file for complete search history.

(56) References Cited

U.S. PATENT DOCUMENTS

| 9,263,485 | B2 | 2/2016 | Furuta | |
|---|---|---|---|---|
| 9,437,645 | B1* | 9/2016 | Chou | H01L 27/14645 |
| 2012/0261782 | A1* | 10/2012 | Kobayashi | H01L 27/14621 257/E31.127 |
| 2013/0285179 | A1* | 10/2013 | Lin | H01L 27/1464 257/E31.127 |
| 2019/0157329 | A1* | 5/2019 | Kim | H01L 27/14612 |

FOREIGN PATENT DOCUMENTS

KR 10-2017-0019012 A 2/2017

* cited by examiner

*Primary Examiner* — Tucker J Wright
(74) *Attorney, Agent, or Firm* — Perkins Coie LLP

(57) ABSTRACT

Image sensor devices including photo detectors located relative to one another to form an array, color filters located above the photo detectors, respectively, to filter incident light that are received by the photo detectors, respectively, a first grid structure including a first material having refractive index lower than a refractive index of the color filters and disposed between color filters adjacent to each other, and a second grid structure including a second material having refractive index lower than the refractive index of the color filters and disposed inside the first grid structure.

17 Claims, 7 Drawing Sheets

IMAGE SENSOR

CROSS-REFERENCES TO RELATED APPLICATION

The present application claims the priority and benefits of Korean application number 10-2019-0101801, filed on Aug. 20, 2019, which is incorporated herein by reference in its entirety as part of the disclosure of this patent document.

TECHNICAL FIELD

Various embodiments generally relate to an image sensor including color filters disposed adjacent to each other.

BACKGROUND

An image sensor refers to a semiconductor device for capturing an optical image to covert that optical image into electrical signals. The recent development of automotive, medical, computer, and communication industries is leading to an increase in the demand for enhanced image sensors in various devices such as smart phones, digital cameras, game machines, IOT (Internet of Things), robots, security cameras and medical micro-cameras.

The most common types of image sensors are charge coupled device (CCD) image sensors and complementary metal oxide semiconductor (CMOS) image sensors. CCD image sensors have advantages over the CMOS image sensor in terms of noise characteristics and image quality. However, CMOS image sensors are now widely used due to certain advantages over the CCD counterparts, including, e.g., higher frame rates and shutter speed. Furthermore, the CMOS image sensors and signal processing circuitry can be integrated into a single chip, making it possible to miniaturize electronic devices while achieving low power consumption. In addition, the CMOS process technology can enable low cost fabrication processes. Such characteristics of CMOS image sensors make these sensors better suited for implementations in mobile devices.

SUMMARY

The embodiments of the disclosed technology, among other features and benefits, relate to an image sensor that can minimize optical interference between pixels.

In an embodiment, an image sensor includes photo detectors located relative to one another to form an array, color filters located above the photo detectors, respectively, to filter incident light that are received by the photo detectors, respectively, a first grid structure including a first material having refractive index lower than a refractive index of the color filters and disposed between color filters adjacent to each other, and a second grid structure including a second material having refractive index lower than the refractive index of the color filters and disposed inside the first grid structure.

In an embodiment, an image sensor includes a first air area filled with air, a first capping film covering the first air area, a second air area disposed outside the first capping film and filled with air, and a second capping film covering the second air area.

In an embodiment, an image sensor may include: an outer air grid disposed between color filters adjacent to each other; and an inner air grid disposed inside the outer air grid.

The inner air grid may include a first air area filled with air and a first capping film covering the first air area.

The inner air grid may further include a first supporting film covering the first capping film.

The first capping film may have a refractive index higher than that of the air and lower than that of the color filter.

The outer air grid may include a second air area filled with air and a second capping film covering the second air area.

The outer air grid may further include a second supporting film covering the second capping film.

The second capping film may have a refractive index higher than that of the air and lower than that of the color filter.

The inner air grid and the outer air grid may include a first capping film and a second capping film, respectively, which are formed of ULTO (Ultra Low Temperature Oxide).

At least one of a first height, a first width, a second height and a second width of an air grid extended in a row direction of a pixel array may be different from that of an air grid extended in a column direction of the pixel array.

At least one of a height difference and a width difference of an air grid extended in a row direction of a pixel array may be different from that of an air grid extended in a column direction of the pixel array.

At least one of a first height, a first width, a second height and a second width of an air grid disposed adjacent to the center of a pixel array may be different from that of an air grid disposed adjacent to the edge of the pixel array.

At least one of a height difference and a width difference of an air grid disposed adjacent to the center of a pixel array may be different from that of an air grid disposed adjacent to the edge of the pixel array.

In an embodiment, an image sensor may include: a first air area filled with air; a first capping film covering the first air area; a second air area disposed outside the first capping film and filled with air; and a second capping film covering the second air area.

DETAILED DESCRIPTION

Hereafter, various embodiments of the present disclosure will be described with reference to the accompanying drawings.

Figure 1:
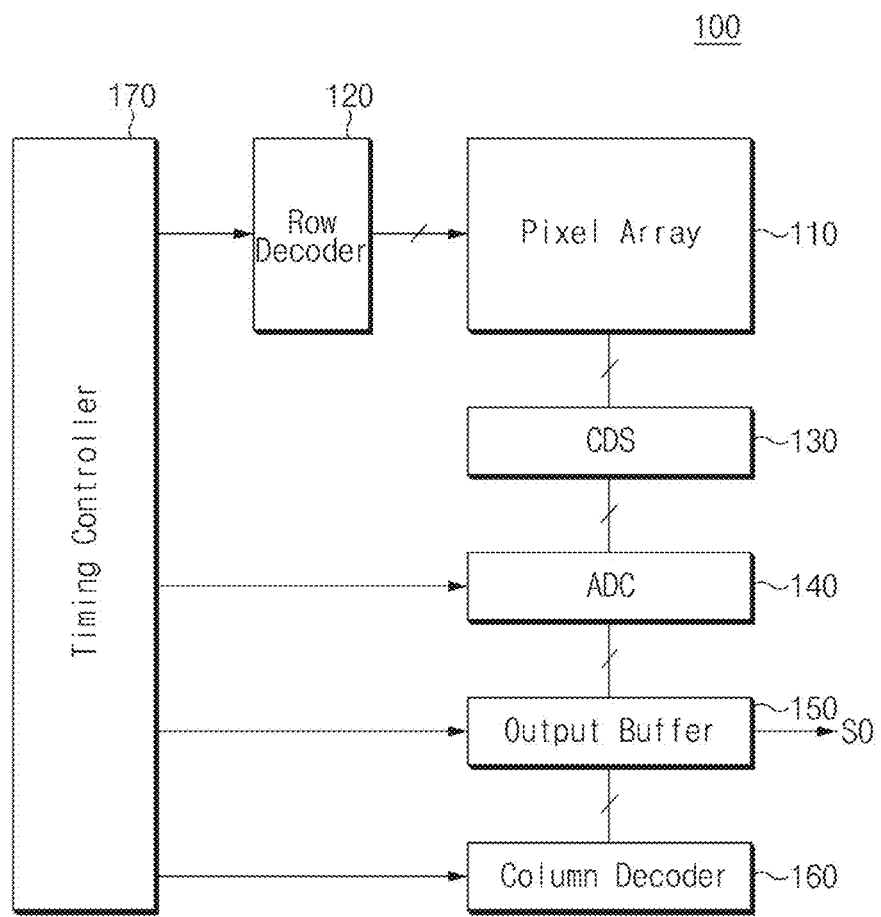
FIG. 1 is a block diagram illustrating an image sensor based on an embodiment of the disclosed technology.

FIG. 1 is a block diagram illustrating an image sensor based on an embodiment of the disclosed technology.

In some implementations, the image sensor 100 may include a pixel array 110, a row decoder 120, a correlated double sampler (CDS) 130, an analog-digital converter (ADC) 140, an output buffer 150, a column decoder 160 and a timing controller 170.

The pixel array 110 may include a plurality of unit pixels UP arranged in a two-dimensional manner. Each unit pixel may convert optical images into electrical signals. In some implementations, such conversion operations can be performed on a shared pixel basis where two or more unit pixels share at least one element. The pixel array 110 may receive operating signals including row select signals, pixel reset signals, transmission signals from the row decoder 120. The pixel array 110 may be operated based on the operating signals.

The row decoder 120 may be used to select desired rows of the pixel array 110 based on control signals generated by the timing controller 170. The row decoder 120 may generate a row select signal for selecting one or more rows of the plurality of rows. In some implementations, the row decoder 120 may also sequentially enable pixel reset signals for resetting pixels and transmission signals for transmitting electrical signals generated by pixels corresponding to the selected one or more rows. Based on such transmission signals, analog reference signals and analog image signals generated from the respective pixels of the selected one or more rows may be sequentially transferred to the CDS 130. In this regard, the reference signal and the image signal may be collectively referred to as a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS 130 may sequentially sample and hold the reference signals and the image signals applied to a plurality of column lines, respectively, from the pixel array 110. That is, the CDS 130 may sample and hold voltage levels of the reference signals and the image signals generated by the pixels corresponding to the respective columns of the pixel array 110.

The CDS 130 may transfer the reference signals and the image signals of the respective columns as correlate double sampling signals to the ADC 140 under control of the timing controller 170.

The ADC block is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may convert the correlate double sampling signals outputted from the CDS 130 into digital signals on a column basis, and output the digital signals. In some implementations, the ADC 400 samples an input signal (e.g., pixel signal) multiple times using the reference signal and analog-to-digital convert the sampled input signals by counting the number of clock pulses until crossing points. The ADC 140 may perform such a counting operation based on the correlate double sampling signals for the respective columns and a ramp signal provided from the timing controller 170, thereby generating digital image data while minimizing noises corresponding to the respective columns such as intrinsic reset noises of the respective pixels.

The ADC 140 may include a plurality of column counters corresponding to the respective columns of the pixel array 110, and generate digital image data by converting the correlate double sampling signals corresponding to the respective columns into digital signals using the column counters. In another embodiment, the ADC 140 may include one global counter, and convert the correlate double sampling signals corresponding to the respective columns into digital signals using a global code provided from the global counter.

The output buffer 150 may capture column-based image data provided from the ADC 140, and output the captured image data. The output buffer 150 may temporarily store the image data outputted from the ADC 140 under control of the timing controller 170. The output buffer 150 may operate as an interface that compensates for data rate difference from another device coupled to the image sensor 100.

The column decoder 160 may be used to select a column of the output buffer 150 under control of the timing controller 170, such that the image data temporarily stored in the selected column of the output buffer 150 are sequentially outputted. In some implementations, the column decoder 160 may, based on an address signal from the timing controller 170, generate a column select signal for selecting a column of the output buffer 150 to output the image data as an output signal SO of the selected column of the output buffer 150.

The timing controller 170 may control the row decoder 120, the ADC 140, the output buffer 150 and the column decoder 160.

The timing controller 170 may generate a clock signal required for the operations of the respective components of the image sensor 100, a control signal for timing control, and address signals for selecting a row or column, and provide the generated signals to the row decoder 120, the column decoder 160, the ADC 140 and the output buffer 150. In an embodiment, the timing controller 170 may include a logic control circuit, a phase locked loop (PLL), a timing control circuit, a communication interface circuit and the like.

Figure 2:
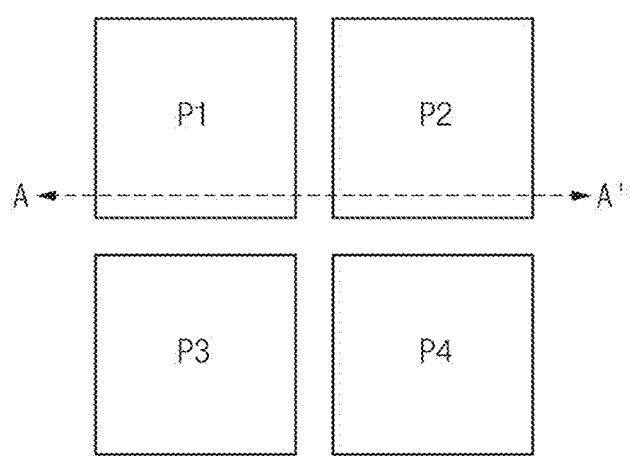
FIG. 2 is a diagram illustrating a part of a pixel array illustrated in FIG. 1.

FIG. 2 illustrates a sub-pixel array of the pixel array illustrated in FIG. 1.

In some implementations, the sub-pixel array 200 of the pixel array 110 may include 4 unit pixels P1 to P4 arranged in a 2×2 matrix. Although FIG. 2 illustrates the sub-pixel array as having only 4 unit pixels P1 to P4, each sub-pixel array can be implemented to have more than 4 unit pixels, and the pixel array 110 may include unit pixels arranged in a matrix of M rows and N columns, where M and N are random positive integers.

Each of the unit pixels P1 to P4 may include a structure for electrical and/or optical isolation from an adjacent unit pixel. As will be discussed below, each of the unit pixels P1 to P4 may include an inter-pixel isolation structure. For example, an imaging device can include an array of unit pixels with photodetectors, an array of color filters located above the photodetectors respectively to filter light received by the photodetectors, and a grid structure formed to separate the color filters and including an outer air grid disposed between color filters adjacent to each other; and an inner air grid disposed inside the outer air grid.

Figure 3:
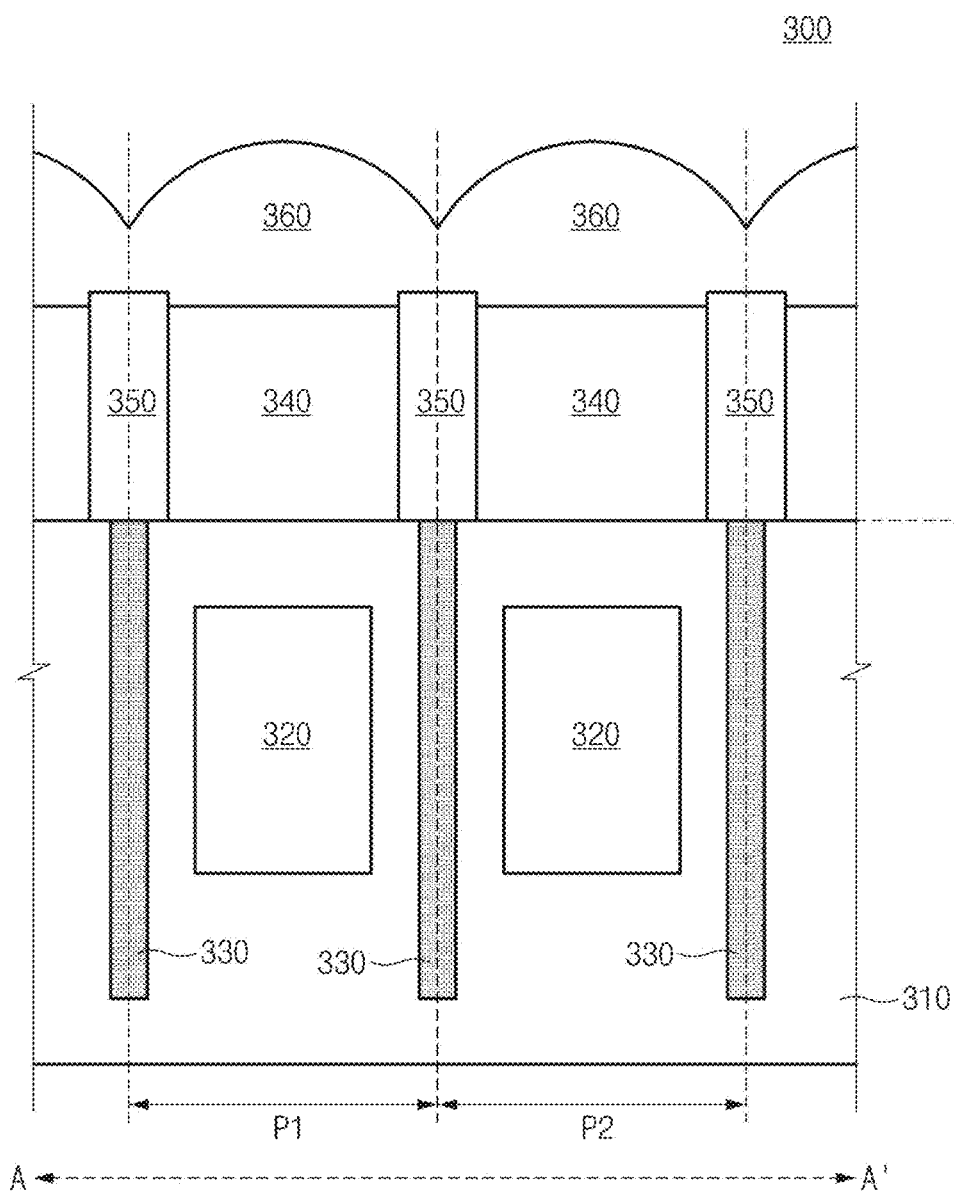
FIG. 3 is a diagram illustrating a cross-section of the pixel array illustrated in FIG. 2.

FIG. 3 illustrates a cross-section of the pixel array illustrated in FIG. 2.

By way of example, FIG. 3 illustrates a cross-section 300 of the pixel array corresponds to a cross-section of first and second pixels P1 and P2, taken along line A-A° of FIG. 2. The other unit pixels included in the pixel array 110 may also have the same or similar structure.

The cross-section 300 of the first and second pixels P1 and P2 may include a substrate 310, a photo detector such as a photodiode 320, an isolation film 330, a color filter 340, a grid structure 350 and a micro-lens 360. The grid structure 350 can be formed of a low-index layer such as an air layer.

In this patent document, the word "air grid" 350 will be used to indicate the grid structure 350 formed of a low-index layer.

As illustrated in FIG. 3, the color filter 340, the air grid 350 and the micro-lens 360 are formed over the substrate 310. The substrate 310 may be a P-type or N-type bulk substrate. In an implementation, the substrate 310 is formed by an epitaxial growth process, growing a P-type or N-type epitaxial layer in a P-type bulk substrate. In another implementation, the substrate 310 is formed by growing a P-type or N-type epitaxial layer in an N-type bulk substrate.

Each of the first or second pixel P1 or P2 includes the photodiode 320 in an area within the substrate 310. The photodiode 320 may be formed as an N-type doped area through an ion implantation process of implanting N-type ions. In an embodiment, the photodiode 320 may be formed by stacking a plurality of layers doped with N-type or P-type impurities on top of each other. In some implementations, at least one portion of the photodiode 320 may include a multi-layer structure where a lower layer is formed by implanting N+ ions and an upper layer is formed by implanting N- ions. The photodiode 320 may be formed such that its light-receiving window is wide enough to improve or maximize the photon detection efficiency.

The isolation film 330 is a structure between two adjacent pixels such as P1 and P2 to separate or isolate the adjacent pixels. In the specific example in FIG. 3, the isolation film 330 may be structured to surround the first or second pixel P1 or P2 entirely or partially, when seen from the top. The isolation film 330 may be formed by filling a deep trench vertically formed in the substrate 310 through a deep trench isolation (DTI) process to electrically and optically isolate the unit pixels from adjacent unit pixels. The depth of the isolation film 330 may be decided based on the sizes of the photodiodes 320 of the unit pixels P1 and P2 and required isolation performance. The isolation film 330 may be a backside DTI, which is formed by performing the DTI process on the back side of the substrate 310. The isolation film 330 may be formed of a dielectric material having a different refractive index (i.e. higher reflectance) from the substrate 310, in order to prevent optical crosstalk and electrical crosstalk. For example, the isolation film 330 may include at least one of silicon oxide, silicon nitride, or silicon oxynitride.

The color filter 340 may be placed above the photo sensing elements such as photodiodes 320 to filter incident light received by the underlying photo sensing elements such as photodiodes 320. In the example in FIG. 3, the color filter 340 is structured to include separately located optical filters that are placed above the photodiodes 320 of the unit pixels, respectively to filter the light to be detected by the photodiodes 320, and selectively transmit light in a specific wavelength range (e.g. wavelengths corresponding to visible light such as red, green, blue, magenta, yellow, cyan and others). In FIG. 3, two adjacent but separated color filters 340 are placed above two adjacent photodiodes 320 of the two adjacent pixels P1 and P2, respectively, so that each color filter is used to control the spectral content or color of the filtered light from the incident light. In an embodiment, an anti-reflection layer (not illustrated) may be formed below the color filter 340. In an embodiment, the color filter 340 may be omitted or replaced with an infrared pass filter, when the unit pixels P1 and P2 are depth pixels.

The air grid 350 may be disposed between adjacent color filers 340 to prevent optical crosstalk between the adjacent color filters 340. The air grid 350 may have a double air grid structure in which two air layers (or low refractive index layers) are combined, and the structure of the air grid 350 will be described below in more detail with reference to FIG. 4. By way of example, FIG. 3 illustrates that the height of the air grid 350 from the top surface of the substrate 310 is larger than the height of the color filter 340. In another implementation, however, the height of the air grid 350 from the top surface of the substrate 310 may be equal to or smaller than the height of the color filter 340.

The micro-lens 360 may be formed over the color filter 340 and the air grid 350, and improve the light receiving efficiency of the photodiode 320 by raising light gathering power for incident light.

Figure 4:
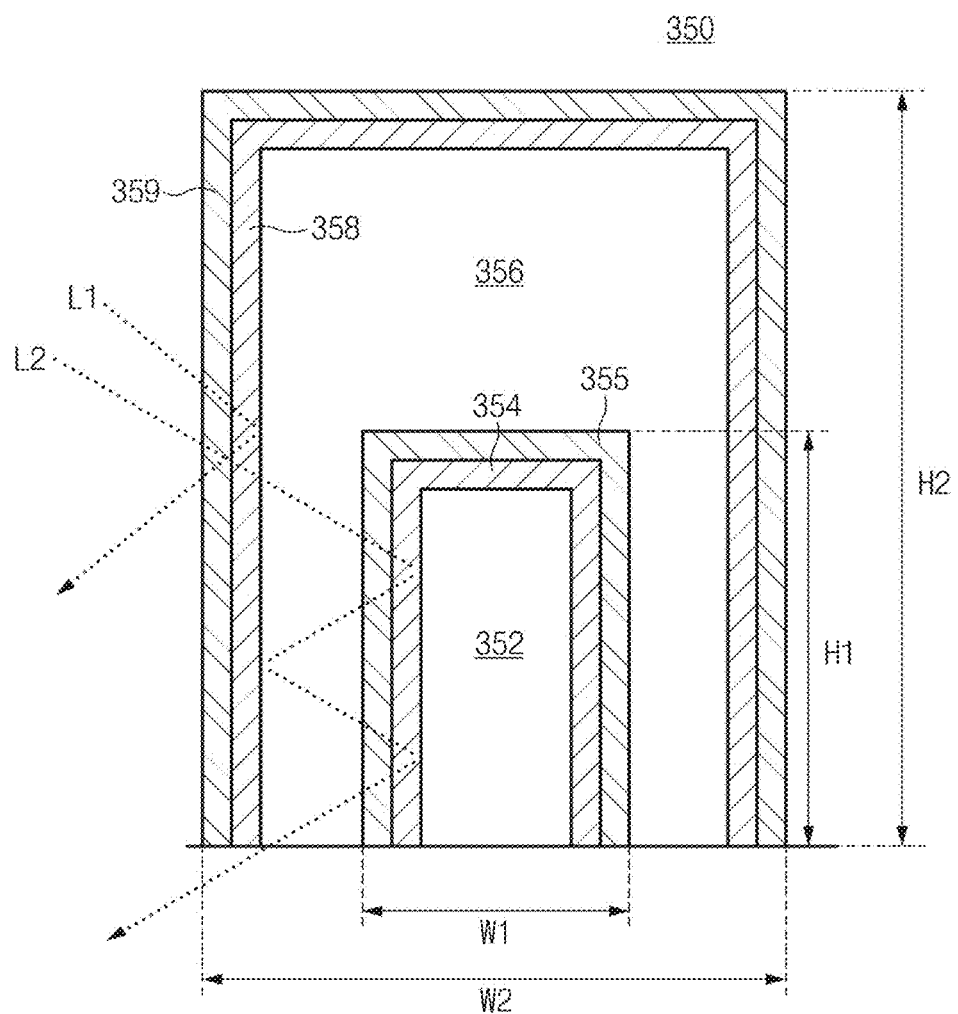
FIG. 4 is a diagram illustrating an air grid of FIG. 3 in more detail.

FIG. 4 illustrates the air grid of FIG. 3 in more detail.

In some embodiments of the disclosed technology, the air grid 350 may include an inner air grid and an outer air grid. The inner air grid may include a first air area 352, a first capping film 354 and a first supporting film 355, and the outer air grid may include a second air area 356, a second capping film 358 and a second supporting film 359. As illustrated in FIG. 4, the inner air grid may be formed inside the outer air grid. The first and second air areas 352 and 356 may be physically isolated from each other by the first capping film 354 and the first supporting film 355, and the second air area 356 may be physically isolated from the outside by the second capping film 358 and the second supporting film 359.

In some embodiments of the disclosed technology, the first air area 352 may be formed of a low index layer with a relatively low refractive index (e.g., 1) such as an air layer. The shape of the first air area 352 may be defined by the first capping film 354.

The first capping film 354 may be formed to cover the first air area 352, That is, the first capping film 354 may abut the side and top surfaces of the first air area 352. The first capping film 354 may have a refractive index higher than the refractive index (e.g., 1) of the first air area 352 and lower than the refractive index (e.g., 1.6 to 1.7) of the color filter 340.

In an embodiment, the first capping film 354 may have a single-layer structure or multilayer structure including an oxide film. In an implementation, the first capping film 354 may have a double oxide structure. In another implementation, the first capping film 354 may have a multilayer structure including an oxide film and a material film which covers the oxide film and is different from the oxide film. The oxide film may include ULTO (ultra low temperature oxide) such as silicon oxide ($SiO_2$).

The first supporting film 355 may include a material film formed at the outermost of the inner air grid to cover the first capping film 354. That is, one side of the first supporting film 355 may abut the first capping film 354, and the other side of the first supporting film 355 may abut the second air area 356. For example, the first supporting film 355 may be a dielectric film including at least one of silicon oxynitride ($Si_xO_yN_z$), silicon oxide ($Si_xO_y$) and silicon nitride ($Si_xN_y$), where x, y and z are natural numbers.

The first supporting film 355 may have a refractive index higher than the refractive index (e.g., 1) of the first air area 352 and lower than the refractive index (e.g., 1.6 to 1.7) of the color filter 340. The first supporting film 355 and the first capping film 354 may be formed of the same material.

The first supporting film 355 may have a larger thickness than the first capping film 354. This is because the first capping film 354 is formed to have as small a thickness as possible, such that an internal material can be effectively discharged to the outside during a plasma process which will be described below, and the first supporting film 355 is formed to have a thickness required for stably maintaining the shape of the first capping film 354.

In some embodiments of the disclosed technology, the second air area 356 may be formed of a low refractive index layer with a relatively low refractive index (e.g., 1), similar to the first air area 352. The shape of the second air area 356 may be defined by the first supporting film 355 and the second capping film 358.

The second capping film 358 is formed to cover the entire second air area 356. That is, the second capping film 358 may abut the side and top surfaces of the second air area 356. The second capping film 358 may have a refractive index higher than the refractive index (e.g., 1) of the second air area 356 and lower than the refractive index (e.g., 1.6 to 1.7) of the color filter 340.

In an embodiment, the second capping film 358 may have a single-layer structure or multilayer structure including an oxide film. In an implementation, the second capping film 358 may have a double oxide structure. In another implementation, the second capping film 358 may have a multilayer structure including an oxide film and a material film which covers the oxide film and is different the oxide film. The oxide film may include ULTO (ultra low temperature oxide) such as silicon oxide ($SiO_2$).

The second supporting film 359 may include a material film formed at the outermost of the outer air grid, is formed to cover the second capping film 358. That is, one side of the second supporting film 359 may abut the second capping film 358, and the other side of the second supporting film 359 may abut the color filter 340. For example, the second supporting film 359 may be a dielectric film including at least one of silicon oxynitride ($Si_xO_yN_z$), silicon oxide ($Si_xO_y$) and silicon nitride ($Si_xN_y$), where x, y and z are natural numbers.

The second supporting film 359 may have a refractive index higher than the refractive index (e.g., 1) of the second air area 356 and lower than the refractive index (e.g., 1.6 to 1.7) of the color filter 340. The second supporting film 359 and the second capping film 358 may be formed of the same material.

The second supporting film 359 may have a larger thickness than the second capping film 358. This is because the second capping film 358 is formed to have as small a thickness as possible, such that an internal material can be effectively discharged to the outside during the plasma process which will be described below, and the second supporting film 359 is formed to have a thickness required for stably maintaining the shape of the second capping film 358.

As shown in FIG. 4, in an embodiment the air grid 350 includes the first supporting film 355 and the second supporting film 359. In another embodiment, however, the air grid 350 may be formed without forming the first supporting film 355 or the second supporting film 359 or both.

In some embodiments of the disclosed technology, the inner air grid and the outer air grid may be arranged such that the center of the inner air grid and the center of the outer air grid may coincide with each other. In FIG. 4, a first width W1 and a first height H1 indicate the width and height of the inner air grid, respectively, and a second width W2 and a second height H2 indicate the width and height of the outer air grid, respectively. The first width W1 and the first height H1 may be smaller than the second width W2 and the second height H2, respectively.

The air grid 350 may prevent light incident on the color filter 340 from being reflected or deflected toward another color filer 340, thereby minimizing optical crosstalk.

Specifically, since the refractive index of the second air area 356 including the low refractive index layer such as the air layer is lower than those of the color filter 340 and the second capping film 358, light is reflected at the second air area 356 toward the unit pixel through a first light path L1.

Whether the light is reflected at the second air area 356 may depend on its incident angle, and thus a portion of the light may not be reflected at the second air area 356. Light that is not reflected by the second air area 356 may propagate toward the second air area 356 (e.g., second light path L2), such light propagating through the second light path L2 may be reflected by the first air area 352 and guided into the unit pixel.

That is, the air grid 350 may reflect the incident light refracted through the outer capping film (e.g., 358) again through the double air grid structure of the inner air grid and the outer air grid and guide the reflected light into the unit pixel, thereby minimizing optical crosstalk between adjacent pixels. Through such a structure, the image sensor based on some embodiments of the disclosed technology can provide an improved image quality.

In an embodiment, the first width W1 of the inner air grid may be equal to or larger than the width of the isolation film 330 illustrated in FIG. 3. In this case, the guide effect for the light having passed through the second capping film 358 may be further increased.

Each of the first height H1 of the inner air grid and the second height H2 of the outer air grid may be set to as large a value as possible, in order to prevent optical crosstalk.

Each of the first width W1 of the inner air grid and the second width W2 of the outer air grid may be set to a value equal to or more than a minimum width for preventing degradation in optical crosstalk by tunneling, and set to as small a value as possible, in order to prevent degradation in light receiving efficiency due to an area reduction of the color filter 340. The air grids included in the pixel array 110 may be divided in first air grids extended and disposed in the row direction and second air grids extended and disposed in the column direction.

Typically, a lens module (not illustrated) may be disposed over the image sensor 100, and a main incident angle of incident light passing through the lens module (not illustrated) may be different in the row direction and the column direction. In this case, the first air grid and the second air grid may be formed in different shapes. The incident angle may indicate an incident angle with respect to the plane of the pixel array 110.

The air grids included in the pixel array 110 may be divided into third air grids disposed adjacent to the center of the pixel array 110 and fourth air grids disposed adjacent to the edge of the pixel array 110.

The main incident angle of the incident light passing through the lens module (not illustrated) may be different at the center and edge of the pixel array 110. In this case, the third air grid and the fourth air grid may be formed in different shapes.

When it is described that the air grids are formed in different shapes, it may indicate that at least one of the first width, the second width, the first height and the second height of any one air grid (for example, the first air grid) is different from that of the other grid (for example, the second air grid). Alternatively, when it is described that the air grids are formed in different shapes, it may indicate that at least one of a width difference W2-W1 and a height difference H2-H1 of any one air grid (for example, the first air grid) is different from that of the other grid (for example, the second air grid).

The different shapes of the air grids may be decided as the optimal shape in consideration of the main incident angle of incident light passing through the lens module (not illustrated), whether optical crosstalk is degraded, and reduction in light receiving efficiency.

FIGS. 5A to 5F are diagrams for describing a process of forming the air grid based on an embodiment of the disclosed technology.

Figure 5A:
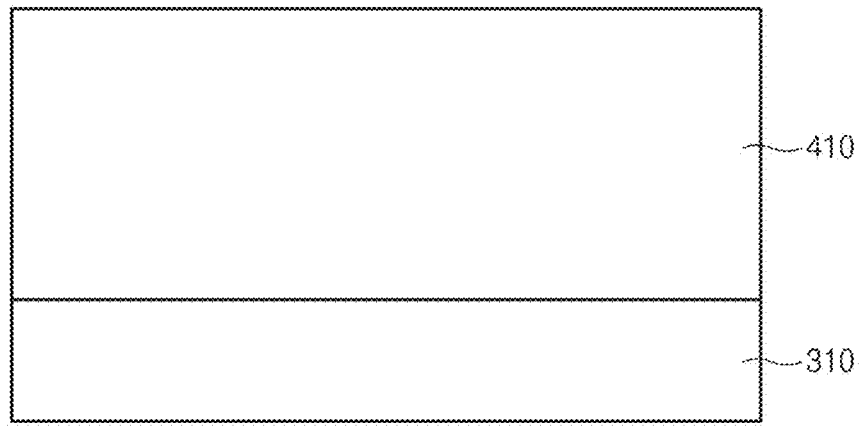
FIGS. 5A to 5F are diagrams for describing a process of forming an air grid based on an embodiment of the disclosed technology.

Referring to FIGS. 5A to 5F, a first sacrificial film 410 may be formed on the substrate 310 in FIG. 5A. The first sacrificial film 410 may include an SOC (Spin On Carbon) film containing carbon.

Although not illustrated in FIG. 5A, a buffer layer (not illustrated) may be formed between the substrate 310 and the first sacrificial film 410, and include a nitride film such as silicon nitride ($Si_xN_y$) or silicon oxynitride ($Si_xO_yN_z$) and an oxide film such as USG (Undoped Silicate Glass) over the nitride film, where x, y and z are natural numbers. Before the first sacrificial film 410 is formed, an anneal process may be performed on the nitride film and the oxide film under a nitrogen ($N_2$) atmosphere. Such a buffer layer is not illustrated in FIGS. 5A to 5F for convenience of description.

Figure 5B:
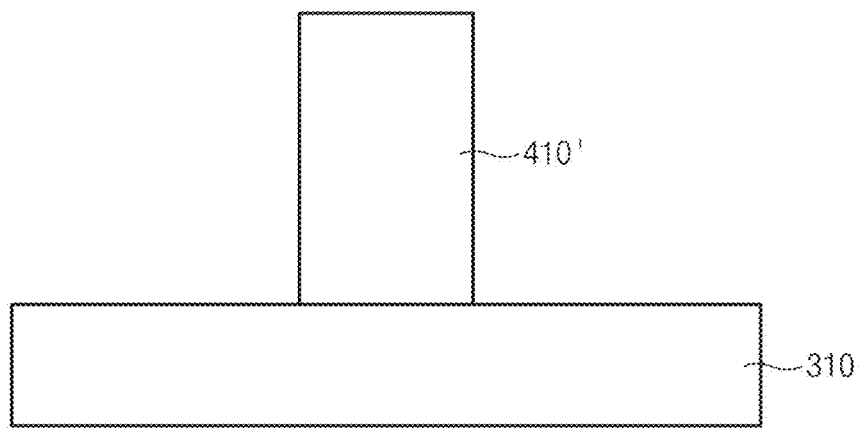

In FIG. 5B, a mask pattern (not illustrated) defining the first air area 352 may be formed on the first sacrificial film 410, and then the first sacrificial film 410 may be etched using the mask pattern as an etch mask, in order to form a first sacrificial film pattern 410'. In one example, the mask pattern formed on the first sacrificial film 410 may include a photoresist pattern.

Figure 5C:
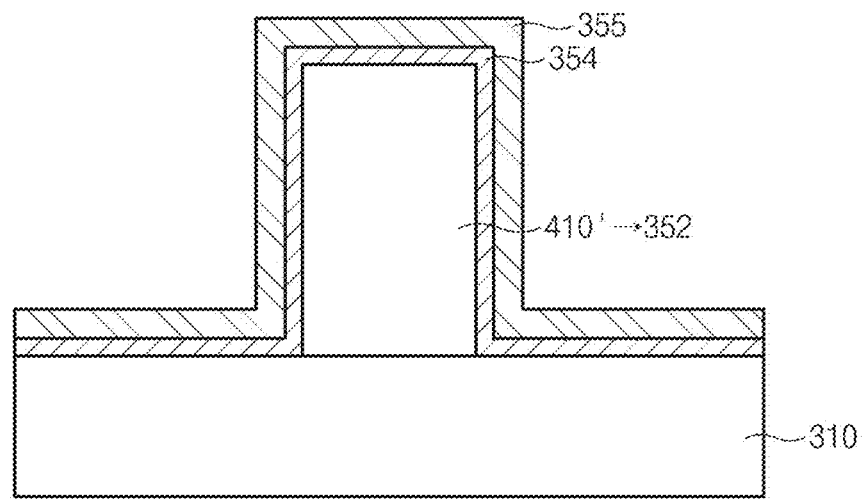

In FIG. 5C, a first capping film 354 may be formed over the first sacrificial film pattern 410' and the substrate 310 through a deposition process. The first capping film 354 may include oxide, for example, ULTO. The first capping film 354 is formed to have such a thickness that molecules produced through bonding between gas used during a subsequent plasma process and carbon of the first sacrificial film pattern 410' can easily escape to the outside. For example, the first capping film 354 may be formed to have a thickness of 300 Å or less.

After the first capping film 354 is formed, the plasma process may be performed to remove the first sacrificial film pattern 410', and the first air area 352 may be formed at the position from which the first sacrificial film pattern 410' is removed. The plasma process may be a plasma process using gas, such as $O_2$, $N_2$, $H_2$, CO, $CO_2$ or $CH_4$, including one or more of oxygen, nitrogen and hydrogen. Here, the $O_2$ plasma process may be taken as an example and described in more detail as follows. Oxygen radicals O* are introduced into the first sacrificial film pattern 410' through the first capping film 354, and then bonded to carbon of the first sacrificial film pattern 410' to produce CO or $CO_2$. The produced CO or $CO_2$ escapes to the outside through the first capping film 354. Through such a process, the first sacrificial film pattern 410' may be removed, and the first air area 352 may be formed at the position from which the first sacrificial film pattern 410' is removed.

In an embodiment, in order to prevent a collapse of the first capping film 354 that can occur while the first sacrificial film pattern 410' is being removed, the plasma process may be performed with a supporting layer (not illustrated), such as an oxide film, formed on the first sacrificial film pattern 410'. Such a supporting layer (not illustrated) may be stacked before the mask pattern is formed on the first sacrificial film 410.

After the plasma process is completed, the first supporting film 355 may be formed on the first capping film 354 through a deposition process. For example, the first supporting film 355 may be a dielectric film including one or more of silicon oxynitride ($Si_xO_yN_z$), silicon oxide ($Si_xO_y$) and silicon nitride ($Si_xN_y$), where x, y and z are natural numbers. The thickness of the first supporting film 355 may be larger than that of the first capping film 354, and the first supporting film 355 may be formed to have a thickness required for stably maintaining the shape of the internal air grid.

Figure 5D:
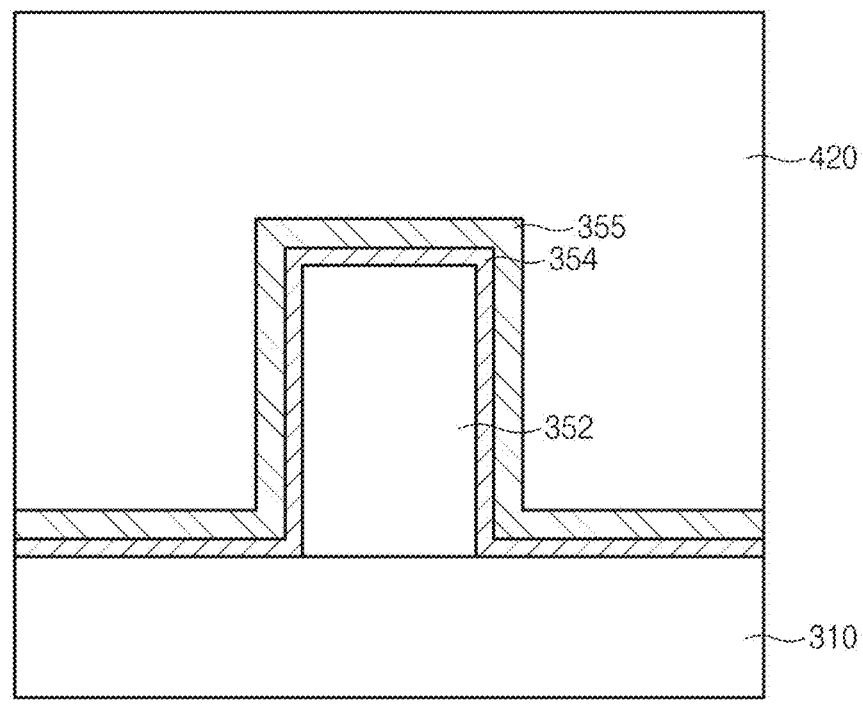

In FIG. 5D, a second sacrificial film 420 may be formed on the first supporting film 355. The second sacrificial film 420 may include an SOC film containing carbon.

Figure 5E:
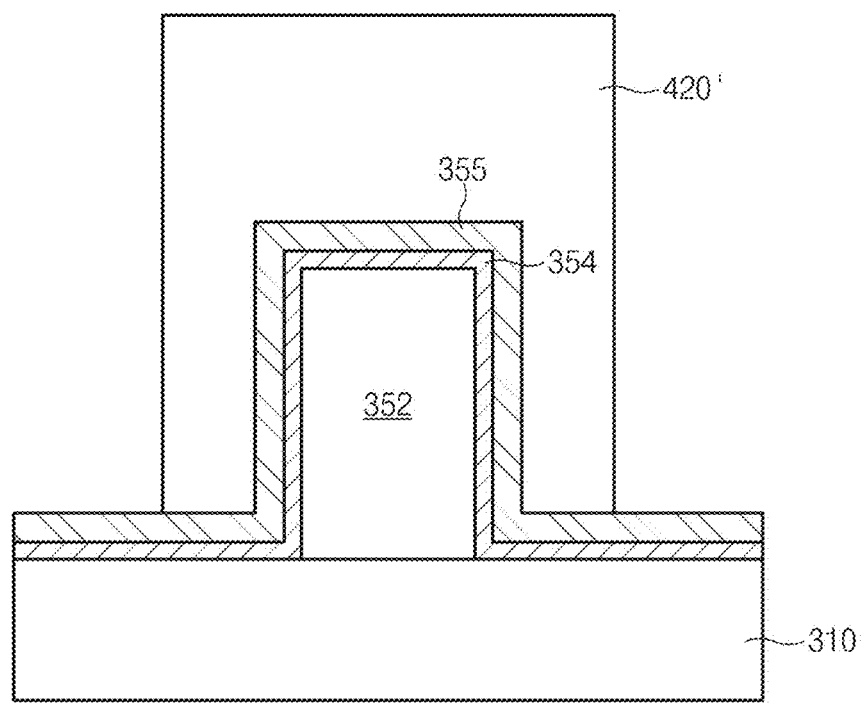

In FIG. 5E, a mask pattern (not illustrated) defining the second air area 356 may be formed on the second sacrificial film 420, and then the second sacrificial film 420 may be etched using the mask pattern as an etch mask, in order to form a second sacrificial film pattern 420'. The mask pattern formed on the second sacrificial film 420 may include a photoresist pattern.

Figure 5F:
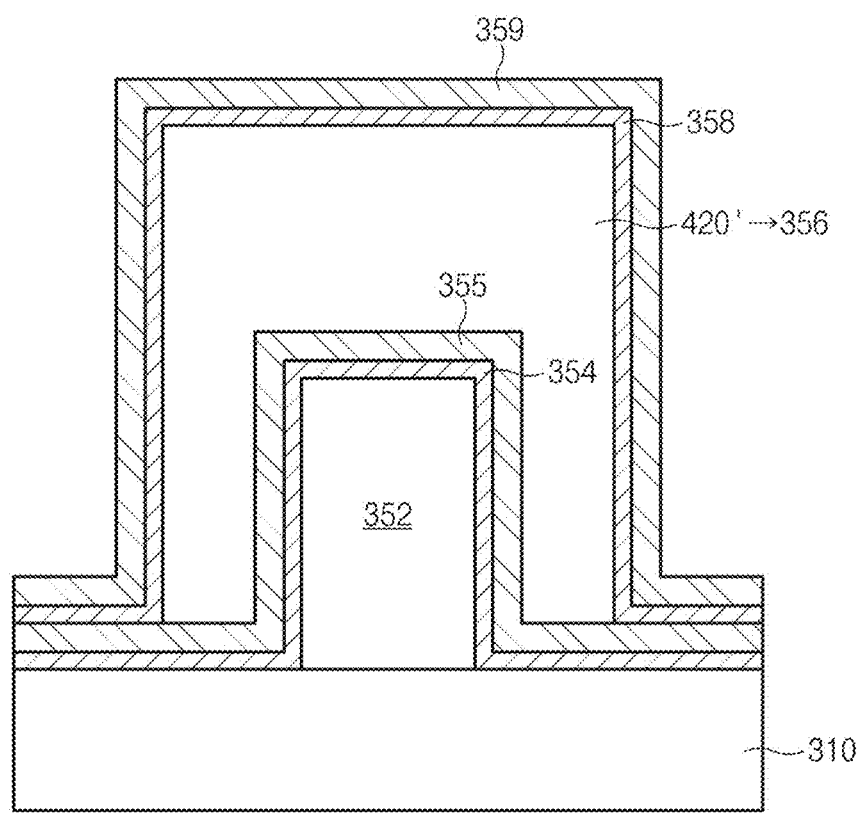

In FIG. 5F, the second capping film 358 may be formed over the second sacrificial film pattern 420' and the first supporting film 355 through a deposition process. The second capping film 358 may include oxide, for example, ULTO. The second capping film 358 is formed to have such a thickness that molecules produced through bonding between gas used during a subsequent plasma process and carbon of the second sacrificial film pattern 420' can easily escape to the outside. For example, the second capping film 358 may be formed to have a thickness of 300 Å or less.

After the second capping film 358 is formed, the plasma process may be performed to remove the second sacrificial film pattern 420', and the second air area 356 may be formed at the position from which the second sacrificial film pattern 420' is removed. At this time, the plasma process may be a plasma process using gas, such as $O_2$, $N_2$, $H_2$, CO, $CO_2$ or $CH_4$, including one or more of oxygen, nitrogen and hydrogen. Here, the $O_2$ plasma process may be taken as an example and described in more detail as follows. Oxygen radicals O* are introduced into the second sacrificial film pattern 420' through the second capping film 358, and then bonded to carbon of the second sacrificial film pattern 420' to produce CO or $CO_2$. The produced CO or $CO_2$ escapes to the outside through the second capping film 358. Through such a process, the second sacrificial film pattern 420' may be removed, and the second air area 356 may be formed at the position from which the second sacrificial film pattern 420' is removed.

In an embodiment, in order to prevent a collapse of the second capping film 358 that can occur while the second sacrificial film pattern 420' is being removed, the plasma process may be performed with a supporting layer (not illustrated), such as an oxide film, formed on the second sacrificial film pattern 420'. Such a supporting layer (not illustrated) may be stacked before the mask pattern is formed on the second sacrificial film 420.

After the plasma process is completed, the second supporting film 359 may be formed on the second capping film 358 through a deposition process. For example, the second supporting film 359 may be a dielectric film including one or more of silicon oxynitride ($Si_xO_yN_z$), silicon oxide ($Si_3O_y$) and silicon nitride ($Si_xN_y$), where x, y and z are natural numbers. The thickness of the second supporting film 359 may be larger than that of the second capping film 358, and the second supporting film 359 may be formed to have a thickness required for stably maintaining the shape of the outer air grid.

In FIGS. 5C and 5F, the plasma processes for forming the first and second air areas 352 and 356 are illustrated as being performed separately. In another embodiment, however, only one plasma process for forming the first and second air areas 352 and 356 may be performed in the step of FIG. 5F without the plasma process of FIG. 5C. In this case, when the processes of FIGS. 5D and 5E are performed, the first sacrificial film pattern 410' may function as a supporting structure, thereby contributing to maintaining the shape of the first air grid. Furthermore, in order to facilitate the gas discharge through the plasma process, the process of forming the first supporting film 355 may be omitted.

As align keys used for the processes for forming the first and second air grids, the same align key may be used without the need to use a separate align key in each of the processes, because substantially the same process is repeated. For this reason, the probability that the position of the inner air grid will be misaligned from the position of the outer air grid can be significantly lowered to improve the process yield.

FIG. 5F illustrates that the first and second capping films 354 and 358 and the first and second supporting films 355 and 359 are stacked and disposed substantially along the top of the substrate 310. However, it should be noted that, in FIG. 4, the first and second capping films 354 and 358 and the first and second supporting films 355 and 359, which are disposed over the substrate 310, are omitted for convenience of description.

In some embodiments of the disclosed technology, the double air grid structure of the image sensor can reflect incident light refracted through the outer capping film, and guide the reflected light into the unit pixel, thereby minimizing optical crosstalk between the pixels adjacent to each other. Thus, the image sensor can provide an improved image quality.

In addition, various effects which are directly or indirectly understood through this document can be provided.

The various embodiments of this document and the terms used herein do not limit technical features described in this document to specific embodiments, but it should be understood that various modifications, equivalents or substitutes of the corresponding embodiments are included in the present disclosure. In relation to the descriptions of the drawings, like reference numerals may be used for similar or related components. The singular form of a noun corresponding to an item may include one or more items unless referred to the contrary in the related context. In this document, each of phases such as "A or B", "at least one of A and B", "at least one of A or B", "A, B or C", "one or more of A, B and C" and "at least one of A, B or C" may include all possible combinations of items listed with the corresponding phrase among the phrases. The terms such as "first" and "second" may be simply used to distinguish corresponding components from other components, and do not limit the corresponding components in terms of another aspect (for example, importance or order). When it is mentioned a certain component (for example, first component) is coupled or connected to another component (for example, second component) with a term such as "functionally" or "communicably" or without such a term, it indicates that the first component may be directly (for example, in a wired manner), wirelessly or through a third component connected to the second component.

In accordance with various embodiments, each of the above-described components (for example, module or program) may include a single object or a plurality of objects. In accordance with various embodiments, one or more components of the above-described components or one or more operations may be omitted, or one or more other components or operations may be added. Alternatively or additionally, a plurality of components (for example, modules or programs) may be merged into one component. In this case, the merged component may perform one or more functions of each of the plurality of components in the same or similar manner as or to a method performed by the corresponding component among the plurality of components before the merge. In accordance with the various embodiments, operations performed by modules, programs or other components may be performed sequentially, in parallel, repeatedly or heuristically, one or more of the operations may be performed in other orders or omitted, or one or more other operations may be added.

What is claimed is:

1. An image sensor comprising:
photo detectors located relative to one another to form an array;
color filters located above the photo detectors, respectively, to filter incident light that are received by the photo detectors, respectively;
a first grid structure including a first material having refractive index lower than a refractive index of the color filters and disposed between color filters adjacent to each other; and
a second grid structure including a second material having refractive index lower than the refractive index of the color filters and disposed inside the first grid structure,
wherein the second grid structure comprises a first air area including air and a first capping film covering the first air area.

2. The image sensor of claim 1, wherein the second grid structure further comprises a first supporting film covering the first capping film.

3. The image sensor of claim 1, wherein the first capping film has a refractive index higher than that of the air and lower than that of the color filter.

4. The image sensor of claim 1, wherein the first grid structure comprises a second capping film, and each of the first capping film and the second capping film includes an ultra low temperature oxide (ULTO).

5. The image sensor of claim 1, wherein the second grid structure disposed inside the first grid structure has a first height and a first width and the first grid structure has a second height and a second width, and wherein at least one of the first height, the first width, the second height and the second width of the first and second grid structures arranged in a row direction of a pixel array is different from the corresponding one of the first height, the first width, the second height and the second width of the first and second grid structures arranged in a column direction of the pixel array.

6. The image sensor of claim 1, wherein the second grid structure disposed inside the first grid structure has a first height and a first width and the first grid structure has a second height and a second width, and wherein at least one of a height difference between the first height and the second height and a width difference between the first width and the second width of the first and second grid structures arranged in a row direction of a pixel array is different from the corresponding one of the height difference between the first height and the second height and the width difference between the first width and the second width of the first and second grid structures arranged in a column direction of the pixel array.

7. The image sensor of claim 1, wherein the second grid structure disposed inside the first grid structure has a first height and a first width and the first grid structure has a second height and a second width, and wherein at least one of the first height, the first width, the second height and the second width of the first and second grid structures disposed adjacent to a center of a pixel array is different from the corresponding one of the first height, the first width, the second height and the second width of the first and second grid structures disposed adjacent to an edge of the pixel array.

8. The image sensor of claim 1, wherein the second grid structure disposed inside the first grid structure has a first height and a first width and the first grid structure has a second height and a second width, and wherein at least one of a height difference between the first height and the second height and a width difference between the first width and the second width of the first and second grid structures disposed adjacent to a center of a pixel array is different from the corresponding one of the height difference between the first height and the second height and the width difference between the first width and the second width of the first and second grid structures disposed adjacent to an edge of the pixel array.

9. The image sensor of claim 1, wherein the first material is the same material as the second material.

10. An image sensor comprising:
photo detectors located relative to one another to form an array;
color filters located above the photo detectors, respectively, to filter incident light that are received by the photo detectors, respectively;
a first grid structure including a first material having refractive index lower than a refractive index of the color filters and disposed between color filters adjacent to each other; and a second grid structure including a second material having refractive index lower than the refractive index of the color filters and disposed inside the first grid structure, wherein the first grid structure comprises a second air area including air and a second capping film covering the second air area.

11. The image sensor of claim 10, wherein the first grid structure further comprises a second supporting film covering the second capping film.

12. The image sensor of claim 10, wherein the second capping film has a refractive index higher than that of the air and lower than that of the color filter.

13. An image sensor comprising:
a first air area filled with air;
a first capping film covering the first air area;
a second air area disposed outside the first capping film and filled with air; and
a second capping film covering the second air area.

14. The image sensor of claim 13, wherein the second capping film is disposed between color filters adjacent to each other.

15. The image sensor of claim 14, wherein the first capping film has a refractive index higher than that of the air and lower than that of the color filter.

16. The image sensor of claim 14, wherein the second capping film has a refractive index higher than that of the air and lower than that of the color filter.

17. The image sensor of claim 13, wherein each of the first and second capping films is formed of ULTO.

* * * * *